United States Patent [19]

Mojaradi et al.

[11] Patent Number: 5,349,223
[45] Date of Patent: Sep. 20, 1994

[54] HIGH CURRENT HIGH VOLTAGE VERTICAL PMOS IN ULTRA HIGH VOLTAGE CMOS

[75] Inventors: Mohamad M. Mojaradi, Los Angeles; Tuan A. Vo, Hawthorne; Steven A. Buhler, Redondo Beach, all of Calif.

[73] Assignee: Xerox Corporation, Stamford, Conn.

[21] Appl. No.: 166,400

[22] Filed: Dec. 14, 1993

[51] Int. Cl.$^5$ ..................... H01L 29/68; H01L 29/78; H01L 29/40
[52] U.S. Cl. ..................... 257/329; 257/339; 257/343; 257/630
[58] Field of Search ............... 257/329, 331, 334, 335, 257/337, 339, 340, 341, 343, 629, 630

[56] References Cited

U.S. PATENT DOCUMENTS

| | | | |
|---|---|---|---|
| 3,821,776 | 6/1974 | Hayashi et al. | 257/540 |
| 5,250,449 | 10/1993 | Kuroyanagi et al. | 257/339 |

FOREIGN PATENT DOCUMENTS

| | | | |
|---|---|---|---|
| 0485648 | 5/1992 | European Pat. Off. | 257/339 |
| 63-73564 | 4/1988 | Japan | 257/341 |
| 01191477 | 8/1989 | Japan | 257/343 |

*Primary Examiner*—J. Carroll
*Attorney, Agent, or Firm*—Nola Mae McBain

[57] ABSTRACT

A vertical transistor which is built in a substrate of a given first carrier type utilizing standard processes but which has a unique layout which facilitates high voltage, high current operation while still conserving space. The transistor is built utilizing a repeatable combination gate/source area that is built in the upper area of the substrate such that the remaining lower portion of the substrate underneath the combination gate/source area is the drain area of the transistor.

5 Claims, 3 Drawing Sheets

HIGH CURRENT HIGH VOLTAGE VERTICAL PMOS IN ULTRA HIGH VOLTAGE CMOS

BACKGROUND

This invention relates generally to high voltage transistors and more particularly concerns a high current, high voltage PMOS transistor which is fabricated in a vertical configuration to increase current handling of the transistor and to reduce silicon area needed to produce the transistor.

PMOS transistors are lateral devices. In high voltage applications, the transistor is designed to withstand high voltages by constructing field plates around the drain and n-well regions. The field plates even out the equipotential field lines to avoid voltage concentrations. To increase current handling capability, the device area of the transistor is increased. Therefore, high voltage, high current transistors require a large area of silicon to accommodate the field plates and large device areas.

FIG. 1 shows a cross-sectional view of a conventional high voltage PMOS device 10. As the conventional PMOS device 10 is a symmetrical, circular device only one-half of the device is shown in FIG. 1. The conventional PMOS device 10 is symmetrical across the centerline C₁. The conventional PMOS device 10 has all the elements of a standard high voltage PMOS device, i.e., a source 12, a gate area 14, a drain 16, an inner field plate 18, and an outer field plate 20.

The drain 16 is the innermost region. Adjacent and immediately outside of the drain 16 is an inner field plate 18. Underneath the inner field plate 18 is a p-pinchoff region 17. Adjacent to and outside of the inner field plate 18 and the p-pinchoff region 17 is the gate area 14. Adjacent to and above the gate area 14 is a gate 13. Adjacent to and outside of the gate area 14 is an n-well connection 19. Adjacent to and outside of the n-well connection 19 is the outer field plate 20. Extending underneath the areas of the drain 16, the p-pinchoff region 17, the gate area 14, the source 12 and past the n-well connection 19 is an n-well 22. The outer field plate 20 provides high voltage capability to the n-well 22. Extending underneath and past the outer field plate 20 and overlapping with the outermost edge of the n-well 22 is a field oxide 26. Extending underneath the field oxide 26 is a n-pinchoff region 24.

To accommodate large voltages and large currents, the conventional high voltage PMOS device 10 is designed to cover a large area. The inner field plate 18 and the outer field plate 20 are used to avoid bunching of equipotential lines which can cause the conventional PMOS device 10 to break down in operation. The field plates 18, 20 are what give the vertical PMOS device 30 its high voltage capability. The outer field plate 20 provides high voltage capability to the n-well 22.

Current flows laterally along line L₁ in the conventional PMOS device 10. The conventional PMOS device 10 is a lateral device since the current flows laterally through the device. To increase the current handling capability of the conventional high voltage PMOS device 10 it is necessary to increase the device area. The result of this is that high voltage, high current transistors require a large area to accommodate the field plates and the current densities.

All of the elements described in the conventional PMOS device 10 are conventional elements made in a conventional manner as is known in the art.

Accordingly, it is the primary aim of the invention to provide a high current, high voltage transistor which uses less silicon area.

Further advantages of the invention will become apparent as the following description proceeds.

SUMMARY OF THE INVENTION

Briefly stated and in accordance with the present invention, there is provided a vertical PMOS transistor which can withstand high voltages and high currents, and uses a minimum of silicon area to fabricate.

Alpha-Numeric List of Elements

Figure 1:
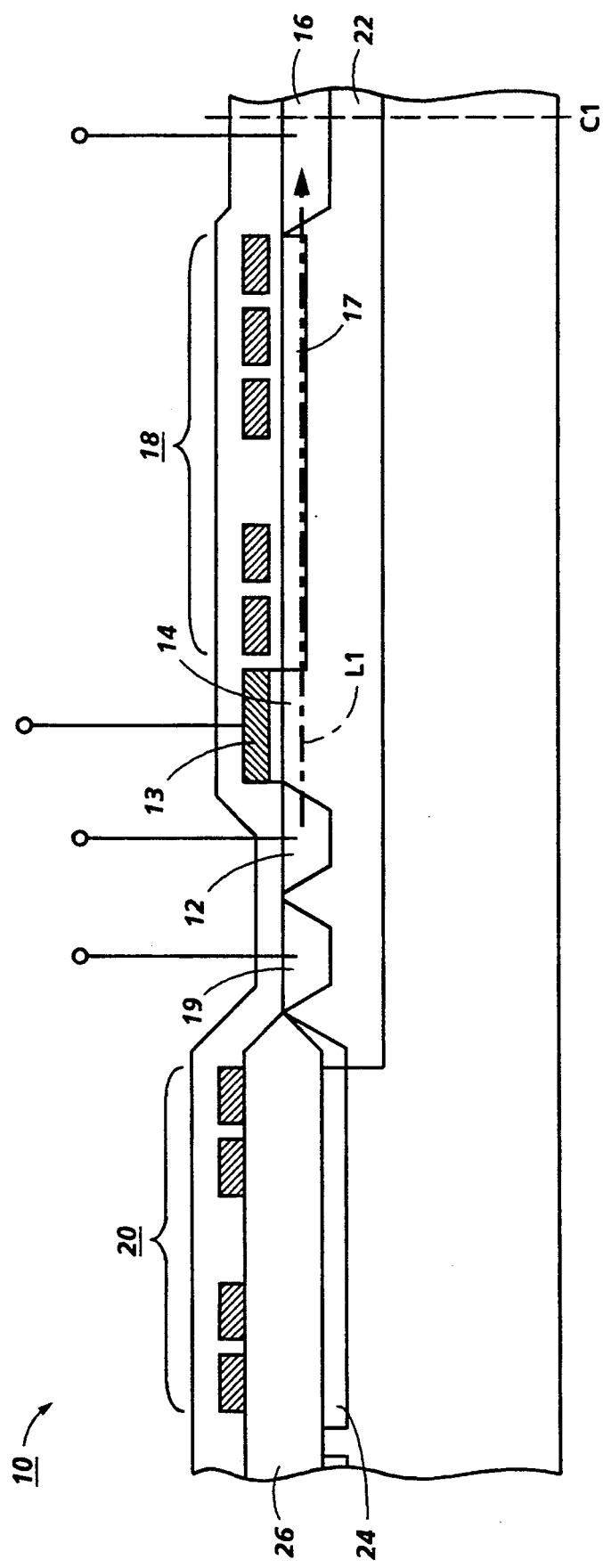
FIG. 1 is a cross-sectional view of a conventional high voltage PMOS transistor.

C1 centerline
C2 centerline
C3 centerline
L1 line
L2 line
L3 line
10 conventional PMOS device
12 source
13 gate
14 gate area
16 drain
17 p-pinchoff region
18 inner field plate
19 n-well connection
20 outer field plate
22 n-well
24 n-pinchoff region
26 field oxide
30 vertical PMOS device
31 gate
32 source
33 gate area
34 gate area
35 combination gate/source region
36 drain
38 field plate
40 n+pinchoff contact
42 drain connection
44 p-pinchoff region
46 p-pinchoff
48 n-well
50 field oxide
52 n-pinchoff region

DETAILED DESCRIPTION OF THE INVENTION

Figure 2:
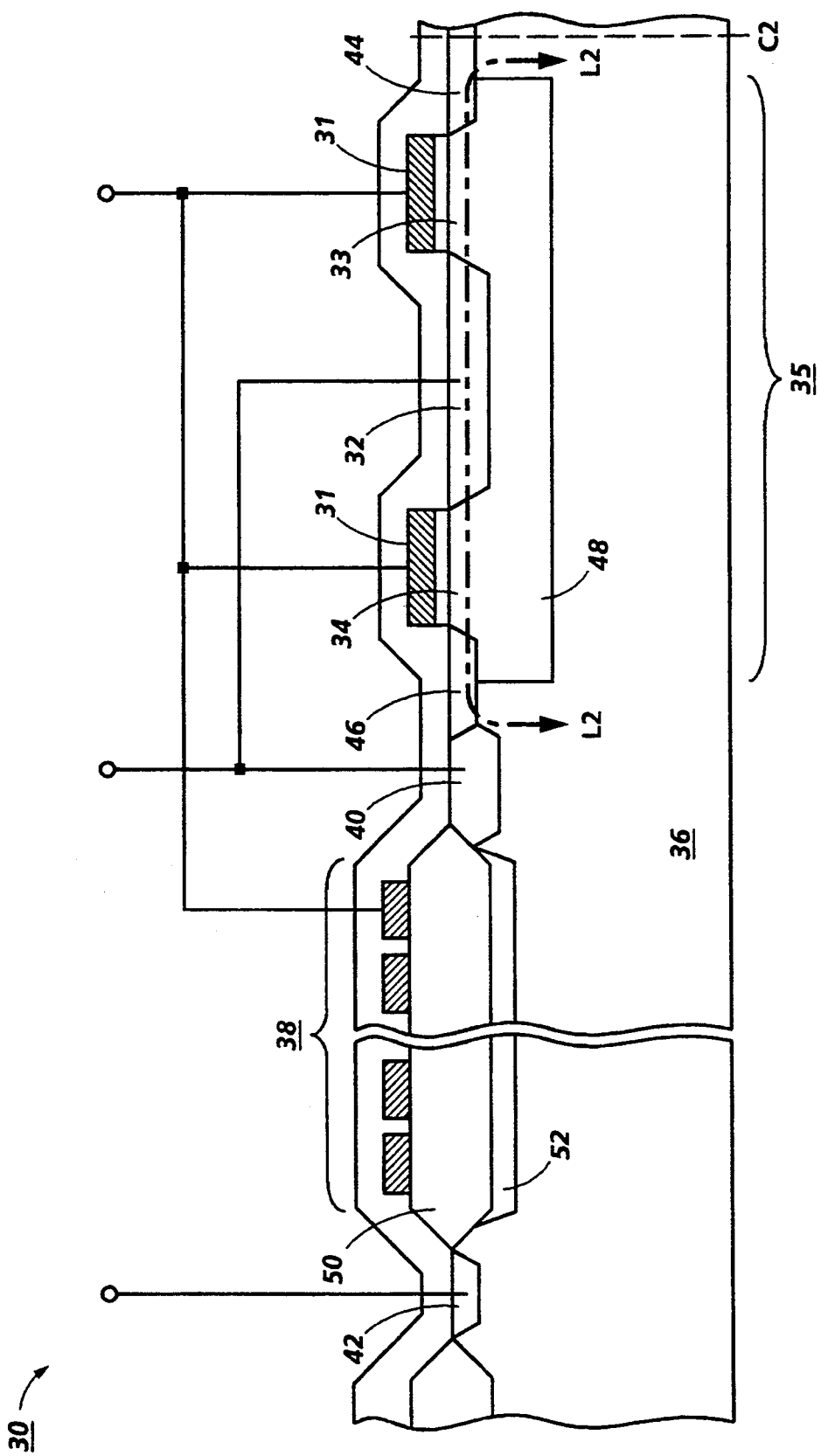
FIG. 2 is a cross-sectional view of a vertical high voltage PMOS transistor.

FIG. 2 shows a cross-sectional view of a vertical PMOS device 30. As the vertical PMOS device 30 is a symmetrical, circular or annular device only one-half of the device is shown in FIG. 2. The vertical PMOS device 30 is symmetrical across the centerline C₂. The vertical PMOS device 30 has all of the same basic elements of the conventional PMOS device 10. Both transistors are composed of a gate, a source, and a drain. However, in the vertical PMOS device 30, the elements are arranged differently to save space while also providing a high voltage and high current capability. Since the fabrication of the vertical PMOS device 30 is accomplished using standard procedures used in making the conventional PMOS device 10, attention will be focused on the spatial arrangements of the elements of the vertical PMOS device 30 and not on the steps or processes used to fabricate the vertical PMOS device 30.

The innermost region is a p-pinchoff region 44 built with a p-type carrier. Adjacent to and outside from the p-pinchoff region 44 is a gate area 33 utilizing an n-type carrier. Adjacent to and outside of the gate area 33 is the source 32 built using a p-type carrier. Adjacent to and outside of the source 32 is another gate area 34 followed by another p-pinchoff 46 using n-type and p-type carriers respectively. Above each of the gate areas 33, 34 is a gate 31. These elements of the two p-pinchoff regions 44, 46, and the two gates 33, 34 form a dual gate region surrounding the source 32. The two gates 31 above each of the gate areas 33, 34 should be electrically connected together for proper operation of the vertical PMOS device 30.

Extending underneath the source 32, the gate area 33, the gate area 34, and partially underneath the p-pinchoff region 44 and the p-pinchoff 46 is an n-well region 48 built using an n-type carrier. Adjacent to and outside of the p-pinchoff 46 is a n+pinchoff contact 40 which is built using an n-type carrier. For proper operation the n-pinchoff region 40 should be connected electrically to the source 32. Adjacent to and outside of the n+pinchoff contact 40, is the field plate 38 built using conventional materials. Extending underneath the field plate 38 is a conventionally built field oxide 50. Extending underneath the field oxide 50 is an n-pinchoff region 52 which is built using an n-type carrier.

Figure 3:
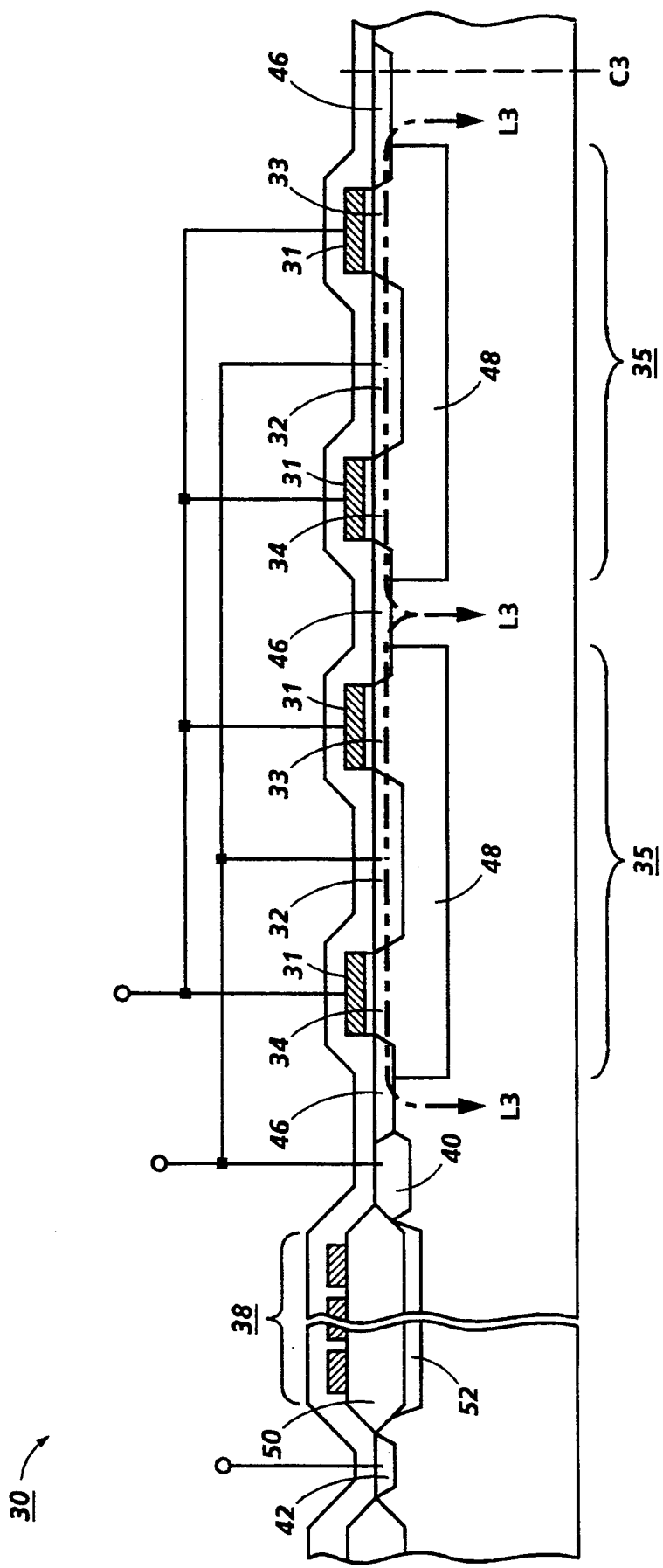
FIG. 3 is a cross-sectional view of a vertical high voltage PMOS transistor with a multiple combination gate/source region.

In the vertical PMOS device 30, the structure comprised of n-well region 48, source 32, gates 33, 34 and p-pinchoff regions 44,46 is called a combination gate/source region 35. This structure can be repeated or built a multiple of times within the vertical PMOS device 30 as shown in FIG. 3. Progressing outward from the centerline C3, the transistor is constructed with the two combination gate/source regions 35. After the second combination gate/source regions 35 the construction of the vertical PMOS device 30 proceeds as in the earlier example with the n-pinchoff contact 40 immediately adjacent to the second combination gate/source region 35. Adjacent to and outside of the n+pinchoff contact 40, is the field plate 38 built using conventional materials. Extending underneath the field plate 38 is a conventionally built field oxide 50. Extending underneath the field oxide 50 is a n-pinchoff region 52 which is built using an n-type carrier. Current flows along lines L3 from the source 32 through the gate area 34 and the p-pinchoff contact 46, then down to the drain 36 in the p substrate. For proper transistor operation the gates in all the combination gate/source areas 35 should be connected to each other. Similarly, all the sources should be connected together as well.

The vertical PMOS device 30 is a vertical device built on a conventional wafer comprised of a p- substrate. This is a substrate that has been doped with a p-type carrier. The construction of a high voltage, high current NMOS device could be accomplished using the same configuration of the vertical PMOS device 30 but with a reversal of all carrier types. That is, all p-type carriers would become n-type carriers and all n-type carriers would become p-type carriers.

In the vertical PMOS device 30 current flows vertically through lines $L_2$ from a source 32 through gates 33, 34 to a drain 36. The dual gate area 33, 34 system surrounding the source 32 allows a larger device area in a small space by providing two current flow paths. The p-substrate of the wafer is used for the drain 36. Using the p- substrate as the drain for the vertical PMOS device 30 allows for a very large device area in a minimum of wafer area since the drain 36 is the wafer substrate underneath the source 32 and the gate area 34. The drain connection 42 is well spaced from the source 32. If the drain connection is made to the back side of the wafer, the drain contact will be typically 18 mils from the source 32. If the drain connection 42 is desired on the front surface of the wafer, it can be isolated from the source 32 by using the field plate 38. Having the drain contact well spaced from the source 32 eliminates the need for the inner field plate 18 shown in FIG. 1 of the conventional PMOS device 10. The elimination of the inner field plate 18 contributes to a further conservation of area.

A field plate 38, equivalent to outer field plate 20 of the conventional PMOS device 10 shown in FIG. 1, is still needed in the vertical PMOS device 30. The field plate 38 performs the identical, conventional function of the outer field plate 20 of the conventional PMOS device 10 shown in FIG. 1.

If it is desired to make a drain connection from the same surface as the source 32 and gate area 34 connections, a drain connection 42 may be implanted outside of the field plate 38. Otherwise a connection could be made to the opposite surface (not shown) from the source 32 and gate area 34 connections. The vertical PMOS device 30 shown in FIGS. 2 and 3 is not a general use device such as the conventional PMOS device 10 shown in FIG. 1. In the conventional PMOS device 10, the drain 16 is constructed as a floating drain to be connected to the most negative potential used. In the vertical PMOS device 30, since the drain 36 utilizes the substrate, it is confined to the substrate potential.

We claim:
1. A vertical transistor comprising:
  a) a substrate of a given first carrier type having an upper area and a lower area,
  b) at least one combination gate/source area with a center wherein said combination gate/source area comprises a well region of a second carrier type, a source region of said first carrier type, first and second gate regions of said second carrier type, and first and second pinchoff regions of said first carrier type, wherein:
    i) said first pinchoff region is in the center,
    ii) said first gate region is adjacent to and surrounds said first pinchoff region,
    iii) said source region is adjacent to and surrounds said first gate region,
    iv) said second gate region is adjacent to and surrounds said source region,
    v) said second pinchoff region is adjacent to and surrounds said second gate region, and
    vi) said well region extends underneath said source region and said first and second gate regions and extends at least partially underneath said first and second pinchoff regions,
  c) a drain area,
  d) said combination gate/source area built in the upper area of said substrate such that the remaining lower portion of said substrate underneath said combination gate/source area is said drain area.

2. The vertical transistor of claim 1 further comprising a second combination gate/source area surrounding said first combination gate/source area:
  a) a first pinchoff region of the second combination gate/source area is adjacent to and surrounds the second pinchoff region of the first combination gate/source area,
  b) a first gate region of the second combination gate source/area is adjacent to and surrounds said first pinchoff region of the second combination gate source/area,
  c) a source region of the second combination gate source/area is adjacent to and surround said first gate region of the second combination gate source/area,
  d) a second gate region of the second combination gate source/area is adjacent to and surrounds said source region of the second combination gate source/area,
  e) a second pinchoff region of the second combination gate source/area is adjacent to and surrounds said second gate region of the second combination gate source/area,
  f) a well region of said second combination gate/source area extends underneath said source region and said first and second gate regions of said second combination gate/source area and extends at least partially underneath said first and second pinchoff regions of said second combination gate/source area, and
  g) a first and second combination gate/source areas are built in the upper area of said substrate such that the remaining lower portion of said substrate underneath said first and second combination gate/source areas is said drain area.

3. The vertical transistor of claim 1 wherein said surrounding areas are annular.

4. The vertical transistor of claim 3 wherein said annular surrounding areas are circular.

5. The vertical transistor of claim 1 further comprising:
  a) a pinchoff contact area of a given second carrier type adjacent to and surrounding said second pinchoff area,
  b) a field plate area adjacent to and surrounding said pinchoff contact area,
  c) a field oxide area substantially underneath said field plate area,
  d) a third pinchoff area, of a given second carrier type, substantially underneath said field oxide area, and
  e) a drain contact area, of a first carrier type, adjacent to and surrounding said field plate area.

* * * * *